United States Patent [19]

Uruma et al.

[11] Patent Number: 5,313,431
[45] Date of Patent: May 17, 1994

[54] MULTIPORT SEMICONDUCTOR MEMORY DEVICE

[75] Inventors: Koji Uruma; Kazunari Inoue; Junko Matsumoto, all of Hyogo, Japan

[73] Assignee: Mitsubishi Denki Kabushiki Kaisha, Tokyo, Japan

[21] Appl. No.: 953,333

[22] Filed: Sep. 30, 1992

[30] Foreign Application Priority Data

Feb. 13, 1992 [JP] Japan .................. 4-26881

[51] Int. Cl.$^5$ ............................................. G11C 7/00
[52] U.S. Cl. .......................... 365/230.05; 365/230.04; 365/205; 365/231; 365/233; 365/195; 365/230.09
[58] Field of Search ............ 365/230.04, 230.05, 365/205, 231, 233, 195, 230.09

[56] References Cited

U.S. PATENT DOCUMENTS

| | | | |
|---|---|---|---|
| 4,366,559 | 12/1982 | Misaizu et al. | 365/205 |
| 4,947,373 | 8/1990 | Yamaguchi et al. | 365/189.04 |
| 5,170,157 | 12/1992 | Ishii | 340/799 |

Primary Examiner—Eugene R. LaRoche
Assistant Examiner—Andrew Tran
Attorney, Agent, or Firm—Lowe, Price, LeBlanc & Becker

[57] ABSTRACT

A multiport memory device includes first and second memory cell arrays divided by a shared sense amplifier circuit, a first serial data register capable of transferring data with a row in the first memory array through a first data bus, a second serial data register capable of transferring data with a row in the second memory array through a second data bus. The multiport memory device activates both the first and second data bus for transferring data of a row in the first or second memory array both to the first and second serial data registers in the same data transfer cycle in response to a dual read transfer instructions.

5 Claims, 13 Drawing Sheets

MULTIPORT SEMICONDUCTOR MEMORY DEVICE

BACKGROUND OF THE INVENTION

1. Field of the Invention

The invention relates to a multiport semiconductor memory device having a RAM port which is accessible in a random sequence and a SAM port which is accessible only in a serial sequence, and particularly to a dual port semiconductor memory device having a RAM port including a DRAM (dynamic random access memory) having a shared sense amplifier structure.

2. Description of the Related Art

In recent years, various technical developments have been rapidly progressed in a field of image processing technology. Such developments include colored display of CRTs (cathode ray tubes) for personal computers, three dimensional display of images in CAD systems (computer aided design systems), enlargement and reduction of images, multi-window display of screens and improvement of image resolutions.

Under these circumstances, image signals are converted into digital signals for processing at a high accuracy. For storing digital image signals, video memories have been developed for various image processing applications. Among these video memories, a video RAM (random access memory) is known as a memory optimized for storing digital image data. The vide RAM has a random access port which is accessible in a random sequence and a serial access port which is accessible in a serial sequence.

FIG. 7 shows a construction of an image processing system using a video RAM. In FIG. 7, the image processing system includes a video RAM 1 for storing image data, a central processing unit (CPU) 5 which accesses video RAM 1 through a data bus 6 in a random sequence, a CRT controller 7 which reads data from a video RAM 1 in a serial sequence, and a CRT display 8 which displays the data read under the control of CRT controller 7 on a screen.

Video RAM 1 includes a dynamic random access memory 2 having dynamic memory cells arranged in rows and columns, a serial access memory 4 having a memory capacity sufficient for storing the data of memory cells in one row of dynamic random access memory 2, and a data transferring bus 3 for transferring data between dynamic random access memory 2 and serial access memory 4.

Dynamic random access memory 2 is accessed through data bus 6 by CPU 5 in a random sequence. Serial access memory 4 is controlled by CRT controller 7 to serially supply stored data in response to a serial clock signal which is externally applied thereto. Generally, a portion including dynamic random access memory 2 is called a RAM port, because it is accessed in a random sequence. A portion including serial access memory 4 is called a SAM port, because it is accessible in a serial sequence.

The memory cells in one row of dynamic random access memory 2 store the data to be displayed on one scanning line in the screen of CRT display 8. Thus, the memory cells in one row of dynamic random access memory 2 correspond to the one scanning line in CRT display 8. The data of the memory cells in one row of dynamic random access memory 2 is transmitted through data transferring bus 3 to serial access memory 4. Serial access memory 4 is responsive to externally applied serial clock signal to have the storage data serially read therefrom and displayed on the screen of CRT display 8 under the control of CRT controller 7.

While the data is being serially read from serial access memory 4, CPU 5 can access dynamic random access memory 2 through data bus 6. Therefore, even while the image data is being displayed on the screen of CRT display 8, CPU 5 can access video RAM 1 to carry out reading of the data, a processing of the read data and writing of the processed data. Therefore, in parallel with the display of the image data on the screen of CRT display 8, CPU 5 can process the image data, so that high-speed processing and displaying of the image data can be carried out.

Generally, a memory having a plurality of access ports is called a multiport memory. The video RAM shown in FIG. 7 has the two ports, i.e., RAM port accessed by CPU 5 and SAM port accessed by CRT controller 7, and thus is called a dual port memory. In the SAM port, data is read from serial access memory 4 in response to an externally applied serial clock signal. The access to the RAM port generally requires toggle of signals *RAS (row address strobe signal) and *CAS (column address strobe signal), so that the SAM port can be accessed at a higher speed than the RAM port.

The dual port RAM has the RAM port and the SAM port which can be independently accessed, so that it can achieve an image processing system which processes the image data at a higher speed than a conventional RAM having only one port, because, in the conventional RAM having only one port, CPU 5 cannot access the RAM and thus remains in a waiting state while the data is being read to the CRT display therefrom.

FIG. 8 shows a specific construction of the conventional video RAM. In FIG. 8, video RAM 1 is comprised of the RAM port including dynamic random access memory 2 (see FIG. 7) and the SAM port including serial access memory 4 (see FIG. 7).

The RAM port includes a memory cell array 9 in which dynamic memory cells are arranged in a matrix of rows and columns, an address buffer 11 which receives address signal bits A0–Aj applied to an address input terminal 10 and generates an internal address signal, a row address decoder 12 which decodes the internal row address signal supplied from address buffer 11 to select a corresponding row in memory cell array 9, a column address decoder 13 which decodes internal column address signal supplied from address buffer 11 to select a corresponding column in memory cell array 9 and connect the selected column to an I/O bus 16.

A RAM IO terminal 14 has a plurality of pin terminals, and a RAM input/output data WIO is formed of multiple bits. Memory cell array 9 is divided into blocks correspondingly to each RAM input/output data bit. Row address decoder 12 selects one row in each block of memory cell array 9, and column address decoder 13 selects one column in each block of memory cell array 9. The RAM port further includes a sense amplifier 17 for sensing and amplifying the data of the memory cells in the selected row in memory cell array 9, and I/O bus 16 for connecting the column selected by column address decoder 13 to a data input/output buffer 15. Data input/output buffer 15 produces, in the data writing operation mode, internal write data from data WIOi supplied to RAM IO terminal 14 and transmits the same to I/O bus 16. In the data reading operation, data input/output buffer 15 produces external read data WIOi from internal read data on I/O bus 16 and transmits the same to terminal 14.

The SAM port includes a serial register 18 having a memory capacity for storing the data for one row in memory cell array 9, and a serial selector 21 for sequentially connecting unit registers included in serial register 18 to a serial data input/output buffer 20. Serial data input/output buffer 20 produces, in the data writing operation, internal write data from serial data SIOi supplied to SAM IO terminal 19 and transmits the same to serial register 18. In the data reading operation, serial data input/output buffer 20 produces external data from data read from serial register 18 onto SAM IO terminal 19. Serial register 18 is divided into blocks, similarly to the block structure of memory cell array 9, which correspond to the pin terminals of SAM IO port 19, respectively.

Serial selector 21 receives an internal column address from address buffer 11 to designate a first address in serial register 18, and sequentially connects the data registers included in serial register 18 to serial data input/output buffer 20 in accordance with a serial shift clock signal SC generated by a timing generator 22.

Data transferring bus 3 is disposed between memory cell array 9 and serial register 18. Data transferring bus 3 is responsive to a transfer instructing signal supplied from timing generator 22 and bidirectionally transfers the data between memory cell array 9 and serial register 18.

Timing generator 22 is shown in FIG. 8 controlling only the data transferring operation of data transferring bus 3, but actually generates various internal control signals in accordance with externally applied control signals SC, DSF, *SE, *WB/*WE, *DT/*OE, *CAS and *RAS.

Signal *RAS provides a timing for generating an internal row address signal by address buffer 11, and activates the RAM port. Signal *RAS (row address strobe signal) is used also as a reference signal in determining the operation mode of the SAM port because it is determined in accordance with the combination of the states of the respective control signals at the falling edges of signal *RAS.

Signal *CAS is a column address strobe signal for providing a timing at which address buffer 11 generates the internal column address signal. Signal *CAS is used also as a timing signal for setting the first address to serial selector 19.

Signal *DT/*OE sets a data output mode in RAM port, and provides a timing for activating the data transferring operation of data transferring bus 3 and for transferring the data.

Signal *WB/*WE sets the RAM port at the data writing mode, and also sets a write per bit operation mode. This write per bit operation is an operation mode, in which intended pin terminals are masked against the data writing to memory cell array 9 from RAM IO terminal 14.

Signal *SE is a serial enable signal for enabling the SAM port.

Signal DSF is a signal for setting a special function of the video RAM, and indicates that the special function is to be set in the video RAM 1 when signal DSF is activated.

Signal SC is a serial clock signal, and provides a timing at which serial selector 21 connects the data register included in serial register 18 to serial data input/output buffer 21.

The access to the RAM port is carried out similarly to a conventional DRAM. Specifically, in response to signals *RAS and *CAS, row and column are selected in memory cell array 9, and the selected memory cells' data is sensed and amplified by sense amplifier 17. The read mode and write mode for the data are selectively set by signals *DT/*OE and *WB/*WE. If signal *DT/*OE is in an active state of "L", the RAM port goes to the data output mode. If signal *WB/*WE is in the active state of "L", RAM port goes to the data write mode.

Data input mode and data output mode of the SAM port is determined by the data transferring cycle which was carried out in the last cycle. When the data was transferred from the RAM port to the SAM port, i.e., from memory cell array 9 to serial register 18, the SAM port goes to the data output mode. When the data is transferred from the SAM port to the RAM port, the SAM port goes to the data input mode. Now, the read transfer cycle for transferring the data from the RAM port to the SAM port will be described below with reference to an operation waveform diagram of FIG. 9.

The read transfer cycle is designated by setting both signals *DT/*OE and DSF at "L" and setting signal *WB/*WE at "H" at the falling edge of signal *RAS. In this read transfer cycle, the RAM port entering the memory cycle by signal *RAS carries out the selection of one row in memory cell array 9 and the sense/amplification of the data of the selected memory cells, and thereafter the data of the selected memory cells are transferred through data transferring bus 3 to serial register 18 in response to the rise of signal *DT/*OE.

That is, in response to the fall of signal *RAS, address signal bits A0–Aj applied to address input terminal 10 are strobed and latched as a row address signal indicating a row address AX. Row address decoder 12 decodes the applied internal row address signal to select the row corresponding to row address AX in memory cell array 9. Then, sense amplifier 17 is activated, and the data of the memory cells connected to the selected row are amplified and latched.

When signal *CAS falls, address signal bits A0–Aj, which have been applied before this fall, are latched as the column address signal indicating a column address AY. Column address AY also indicates a position of the register to be selected first in serial register 18. Serial selector 21 latches an address AY+1. The register in serial register 18 designated by column address AY is connected to serial data input/output buffer 20.

When signal *DT/*OE rises to "H" thereafter, timing generator 22 supplies a read transfer instructing signal RT. Data transferring bus 3 responds to read transfer instructing signal RT by simultaneously transferring the data of the memory cells on one row designated by address AX in the memory cell array 9 to serial register 18. Simultaneously with this data transfer, the data of the memory cell in memory cell array 9 designated by addresses AX and AY is held in serial data input/output buffer 20 through serial register 18.

After the rise of signal *DT/*OE to "H", the data which has been held in serial data input/output buffer 20, is supplied to the SAM IO terminal 19 in response to first applied serial clock signal SC.

Serial register 18 has the internal registers sequentially selected by serial selector 21 in response to serial clock signal SC to be connected to serial data input/output buffer 20. That is, the data of the memory cell designated by addresses AX and AY is supplied from input- /output buffer 20, and subsequently the data at the address AY+1 is transmitted from serial register 18 to serial data input/output buffer 20 to be latched thereat. At this time, serial selector 21 latches an address AY+2.

When the serial clock signal SC is second applied thereafter, serial data input/output buffer 20 respectively supplies the data of address AY+1 held therein to the SAM IO terminal 19, and then latches the data of address AY+2 supplied from serial register 18.

The foregoing operation is repeated, so that the data of addresses AY+2, AY+3 . . . in serial register 18 is sequentially supplied to SAM IO terminal 19 upon each application of serial clock signal SC. The address of serial selector 21 is incremented one by one in accordance with serial clock signals SC.

Now, a write transfer cycle operation for transferring the data from serial register 18 to memory cell array 9 will be described with reference to an operation waveform diagram of FIG. 10. The write transfer cycle is designated by setting signals *WB/*WE, *DT/*OE and DSF at "L" and setting serial enable signal *SE at "H, at the falling edge of signal *RAS. In response to the fall of signal *RAS, address signal bits A0-Aj are latched as a row address signal for designating a row address ax in memory cell array 9, and row address decoder 12 selects corresponding one row in memory cell array 9. Then, in response to the fall of signal *CAS, address signal bits A0-Aj are latched as the column address signal indicating column address AY. In this operation, serial register 18 has already stored the valid data applied through serial data input/output buffer 20. In response to the rise of signal *DT/*OE, timing generator 22 generates write transfer instructing signal WT for transferring the data from serial register 18 to memory cell array 9, and write transfer instructing signal WT is applied to data transferring bus 3. Data transferring bus 3, in response to write transfer instructing signal WT, transfers the data stored in serial register 18 to one row on memory cell array 9 designated by the row address ax. Column address ay which is supplied in this time is held by serial selector 21 as a start address in the next serial write operation. Thereafter, upon each application of serial clock signal SC, data supplied to SAM IO terminal 19 is sequentially written in serial register 18, using address ay as a first or start address.

As described above, the read and write of the SAM port is switched by conducting the read transfer cycle and the write transfer cycle. Signal *SE is a signal for controlling the read and write of the SAM port. When signal *SE is in the inactive state of "H", the data is not written in serial register 18. In an operation waveform diagram of FIG. 10, when signal *SE is "H" at the falling edge of signal *RAS, a pseudo write transfer cycle is carried out. In this pseudo write transfer cycle, the operation similar to the write transfer cycle is carried out, but the data stored in serial register 18 is not transferred to memory cell array 9. The pseudo write transfer cycle is conducted for switching the SAM port from the data output mode to the data input mode. Generally, serial clock signal SC is not generated during the data transfer cycle operation in which data is transferred from serial register 18 to memory cell array 9.

In a processing of the image information at a high definition and high resolution, data to be processed has a remarkably large number of bits, and thus a large memory capacity is required for the dual port RAM (video RAM). The DRAM having the shared sense amplifier structure may be used as the DRAM forming the RAM port in order to achieve the large memory capacity as well as a small chip area and a low current consumption.

FIG. 11 shows a construction of a video RAM in which the DRAM of the shared sense amplifier structure is applied to the RAM port. Referring to FIG. 11, memory cell array 9 shown in FIG. 8 is divided into two memory cell arrays 9l and 9u. Between memory cell arrays 9l and 9u, there are provided a shared sense amplifier circuit 23 and column address decoder 13 commonly used by both of the arrays 9l and 9u. Shared sense amplifier circuit 23 includes sense amplifiers, each of which is normally connected to the column lines (bit line pairs) in memory cell arrays 9l and 9u. In operation, each sense amplifier is connected only to the memory cell array containing the selected row, and is isolated from the memory cell array which does not contain the selected row. Column address decoder 13 and I/O bus 16 are similar to those shown in FIG. 8. After the sense and amplification of the selected memory cells' data by shared sense amplifier circuit 23, column address decoder 13 selects and connects the corresponding column to I/O bus 16 in accordance with the column address signal supplied from address buffer 11.

A first serial register 24l and a second serial register 24u are provided corresponding to two memory cell arrays 9l and 9u, respectively. Serial selectors 21l and 21u set the first or start addresses of first and second serial registers 24l and 24u and also control the shifting operations thereof, respectively.

A data transferring bus 26l is disposed between memory cell array 9l and first serial register 24l. A data transferring bus 26u is disposed between memory cell array 9u and second serial register 24u.

Timing generator 22 is responsive to an array designating signal Ab (e.g., a highest bit in the row address) supplied from address buffer 11 to activate one of data transferring buses 26l and 26u (when the data transfer cycle is designated). A sense amplifier drive circuit 30 is provided in order to selectively connect each sense amplifier in shared sense amplifier circuit 23 to memory cell array 9l or 9u and to control the sensing operation of the same. Sense amplifier drive circuit 30 is responsive to the timing signal (generally, the internal of signal *RAS) supplied from timing generator 22 to generate a sense amplifier activating signal $\phi S$, and is also responsive to array designating signal Ab and a control signal supplied from timing generator 22 to generate connection control signals SI(l) and SI(u) for controlling the connection between each sense amplifier in shared sense amplifier circuit 23 and memory cell arrays 9l and 9u.

According to the structure in which the sense amplifiers are commonly used by memory cell arrays 9u and 9l, the number of sense amplifiers can be reduced to a half as compared with the structure in which sense amplifiers are provided independently for each of memory cell arrays 9l and 9u, so that the area required for the sense amplifiers is reduced to a half, and the current consumption in the sensing operation is also reduced to a half. In this shared sense amplifier structure, the sense amplifiers are disposed between memory cell arrays 9l and 9u, so that the length of the bit lines in memory cell arrays 9l and 9u can be short, and thus a parasitic capacitance of the bit line can be reduced. Therefore, sufficient read voltages can be generated on the bit lines, and the stable sensing operation can be carried out at a high speed.

FIG. 12 shows a construction of a main part of the video RAM shown in FIG. 11. FIG. 12 shows only a part related to one shared sense amplifier 230, i.e., a part related to one column in each of memory cell arrays 9l and 9u.

In FIG. 12, memory cell array 9l includes bit lines 28a and 28b, word line WLl and a memory cell MC connected to word line WLl and bit line 28b. Bit lines 28a and 28b form a bit line pair to which memory cells in one column are connected. Word line WLl connects thereto memory cells in one row of memory cell array 9l. Serial register 24l includes a data register 240l which is provided corresponding to bit lines 28a and 28b of memory cell array 9l. Data transferring bus 26l includes a transfer gate 260l, which is responsive to a read transfer instructing signal RT1 and a write transfer instructing signal WT1 generated from timing generator 22 to transfer the data between data register 240l, and bit lines 28a and 28b.

Memory cell array 9u includes bit lines 29a and 29b, a word line WLu and memory cell MC connected to word line WLu and bit line 29b. Bit lines 28a and 28b form a pair to which memory cells in one column of memory cell array 9u are connected. Word line WLu connects thereto memory cells in one row of memory cell array 9u. Serial register 24u includes a data register 240u which is provided for bit lines 29a and 29b. Data transferring bus 26u includes a transfer gate 260u, which is responsive to a read transfer instructing signal RT2 and a write transfer instructing signal WT2 supplied from timing generator 22 to transfer the data between data register 240u, and bit lines 29a and 29b. Data registers 240l and 240u are provided corresponding to bit line pair 28a and 28b, and to bit line pair 29a and 29b, respectively. Serial registers 24l and 24u have storage capacities sufficient for storing the data of the memory cells in one row of memory cell arrays 9l and 9u, respectively.

Shared sense amplifier circuit 23 includes shared sense amplifier 230, which senses and amplifies a potential on a pair of bit lines 28a and 28b, or on a pair of bit lines 29a and 29b in response to sense amplifier activating signal $\phi S$. Generally, shared sense amplifier 230 includes cross-coupled n-channel MOS transistors (insulating gate type field effect transistors) and cross coupled p-channel MOS transistors. In FIG. 12, shared sense amplifier 230 is shown being activated in response to one control signal $\phi S$.

Shared sense amplifier circuit 23 further includes a connection control gate 32 which is responsive to a connection control signal SI(l) to isolate bit lines 28a and 28b from shared sense amplifier 230, and a connection control gate 33 which is responsive to a connection control signal SI(u) to isolate bit lines 29a and 29b from shared sense amplifier 230.

In shared sense amplifier circuit 23, a column selecting gate is provided for connecting the column (i.e., bit line pair), which is selected by column selecting signal supplied from column address decoder 13, to the I/O bus. In FIG. 12, however, the column selecting gate is not shown for the convenience of clarification of the figure.

Now, the data transferring operation of the video RAM of the shared sense amplifier structure shown in FIGS. 11 and 12 will be described with reference to an operation waveform diagram of FIG. 13. The read transfer cycle and write transfer cycle are designated in a manner similar to that already described with reference to FIGS. 9 and 10. It is assumed that word line WLl in memory cell array 9l is designated in the following description.

In response to the fall of signal *RAS, address buffer 11 applies array designating signal Ab to timing generator 22 and sense amplifier drive circuit 30. Sense amplifier drive circuit 30, in response to the timing control signal supplied from timing generator 22 and array designating signal Ab, sets connection control signal SI(l) at "H" and the connection control signal SI(u) at "L, so that the memory cell array 9l including the selected word line WLl is connected to shared sense amplifier 230 while memory cell array 9u is isolated from the same shared sense amplifier 230. Thereby, bit lines 28a and 28b are connected to shared sense amplifier 230 through the gate 32, and bit lines 29a and 29b are isolated from shared sense amplifier 230 by the gate 33. After the fall of signal *RAS, row address decoder 12 selects word line WLl, so that the data of memory cell MC is transmitted to bit line 28b. When the potential difference between bit lines 28a and 28b increases to a sufficient value, sense amplifier activating signal $\phi S$ is generated, and shared sense amplifier 230 senses and amplifies the data on bit lines 28a and 28b. Then, data BL(l) and *BL(l) on bit lines 28a and 28b have values corresponding to the data read from memory cell MC.

In memory cell array 9u, word line WLu is in an unselected state, so that data BL(u) and *BL(u) on bit lines 29a and 29b hold a precharged intermediate potential (Vcc/2).

Then, timing generator 22 generates the transfer instructing signal. In the read transfer cycle, read transfer instructing signal RT1 is generated in response to the signal Ab. In write transfer cycle, write transfer instructing signal WT1 is generated in response to the signal Ab. Transfer gate 260l transfers the data between data register 240l and bit lines 28a and 28b.

Connection control signal SI(l) has the level further increased from "H" in the selected state. This is done for transmitting the potential level of "H" amplified by shared sense amplifier 230 to bit line 28a or 28b without a signal loss at the gate 32.

When signal *RAS rises to "H" and sense amplifier activating signal $\phi S$ falls to "L" after the data transfer is completed, connection control signals SI(l) and SI(u) cause bit lines 28a, 28b, 29a and 29b to be mutually connected through sense and latch nodes of sense amplifier 230, to be precharged and equalized to the intermediate potential, i.e., precharged potential by precharging/equalizing means (not shown).

When word line WLu is selected, memory cell array 9u is connected to shared sense amplifier 230, and subsequently has the data transferred to and from serial register 24u through transferring bus 26u.

As described above, the RAM port of the shared sense amplifier structure accomplishes the small occupied area and low power consumption. The write and read of the data to and from serial registers 24l and 24u are performed similarly to the video RAM already described with reference to FIG. 8. In this case, one of first serial register 24l and second serial register 24u supplies and receives the data to and from serial data input/output buffer 20 in accordance with a signal DBS (data buffer select) supplied to timing generator 22 (signal path for this operation is not shown in FIG. 11).

In the video RAM of the shared sense amplifier structure described above, the data is transferred only between the memory cell array including the selected row and the associated serial register. Memory cell array 9*l* can transfer the data only to and from first serial register 24*l* through data transferring bus 26*l*. Memory cell array 9*u* can transfer the data only to and from second serial register 24*u* through data transferring bus 26*u*. However, memory cell array 9*l* cannot transfer the data through data transferring bus 26*u* to and from second serial register 24*u*, and memory cell array 9*u* cannot transfer the data through data transferring bus 26*l* to and from first serial register 24*l*. In the video RAM of this shared sense amplifier structure, serial registers 24*l* and 24*u* can transfer the data only to and from restricted rows (e.g., rows for the upper or lower half region on the screen). Meanwhile, in the video RAM shown in FIG. 8, serial register 18 can transfer the data to and from an arbitrary row in memory cell array 9. Therefore, in the video RAM of the shared sense amplifier structure shown in FIG. 11, there may be a disadvantage that image data cannot be processed at a high speed in some applications.

For example, in such a case that the same data is to be written in memory cell arrays 9*l* and 9*u* through serial registers 24*l* and 26*u* for the initial setting of arrays 9*l* and 9*u*, a following operation is required. That is; double buffer select signal DBS designating which register is employs is used to write the same data in first and second serial registers 24*l* and 24*u*, and then the data is transferred between first serial register 24*l* and memory cell array 9*l* and between second serial register 24*u* and memory cell array 9*u*. For this reason, an unnecessary time period is required in the initial setting operation for writing the same data both in first and second serial registers 24*u* and 24*l*.

For example, in the construction shown in FIG. 8, if the initial setting data is written in serial register 18, it is then required only to sequentially apply the row selecting signal from row address decoder 12 to select each row in memory cell array 9 for transferring the data. For the reason described above, as compared with the time period for writing the initial setting data through serial register 18 in FIG. 8 in memory cell array 9, the time period required for writing the initial setting data in first and second serial registers 24*u* and 24*l* becomes longer. Also, signal DBS must be used.

If the data transferring path is fixed, as is done in the video RAM of the shared sense amplifier structure shown in FIG. 11, the data cannot be exchanged between memory cell arrays 9*u* and 9*l*, and thus a high speed processing of the image data cannot be flexibly performed in some image processing applications (e.g., when the same image is to be displayed on both the upper and lower half regions of the screen).

SUMMARY OF THE INVENTION

An object of the invention is to provide a multiport semiconductor memory device of a shared sense amplifier structure, in which a data transferring path between a serial register and a memory cell array can be flexibly established.

Another object of the invention is to provide a multiport semiconductor memory device of a shared sense amplifier structure, in which data of one of serial registers can be written in any row among all rows in a memory cell array.

Still another object of the invention is to provide a multiport semiconductor memory device of a shared sense amplifier structure, in which the data can be transferred from one memory cell array to any serial register.

Briefly speaking, the present invention provides a multiport semiconductor memory device including a DRAM of a shared sense amplifier structure as a RAM port, wherein data of any row in two memory cell arrays divided by a shared sense amplifier is transferred to serial registers, each of which is provided corresponding to each memory cell array, in one data transfer cycle.

A multiport semiconductor memory device according to the invention includes first and second memory arrays divided by a shared sense amplifier, first and second data register circuits which are provided corresponding to the first and second memory arrays, and first and second data transferring circuits for transferring data between first and second memory arrays and first and second data register circuits, respectively. The shared sense amplifier circuit is commonly used by first and second memory arrays, and senses and amplifies data of memory cells connected to a selected row in first and second memory arrays.

The multiport semiconductor memory device according to the invention further includes a connection control circuit for connecting and isolating the shared sense amplifier to and from first and second memory arrays, and a control circuit which controls operations of the connection control circuit and first and second transferring circuits such that, in the first and second memory arrays, the data of the selected memory cells are transferred, in response to a data transfer instruction, to first and second register circuits in the same data transfer cycle.

In the multiport semiconductor memory device according to the invention, the data of any row in the two memory cell arrays divided by the shared sense amplifier can be transferred to both the two serial registers for storage.

After the write transferring operation from one of the two serial register to any row in the associated memory cell array of the arrays divided by shared sense amplifier for writing the data, the data is transferred to both the two serial registers, and thereafter, the write transferring operation is carried out from the other of the serial registers to any row in the other of the memory cell arrays, whereby the data of the one serial register can be written in any row in the other memory array.

In this manner, each serial register (data register circuit) can equivalently transfer the data to and from any row in the first and second memory arrays divided by the shared sense amplifier.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
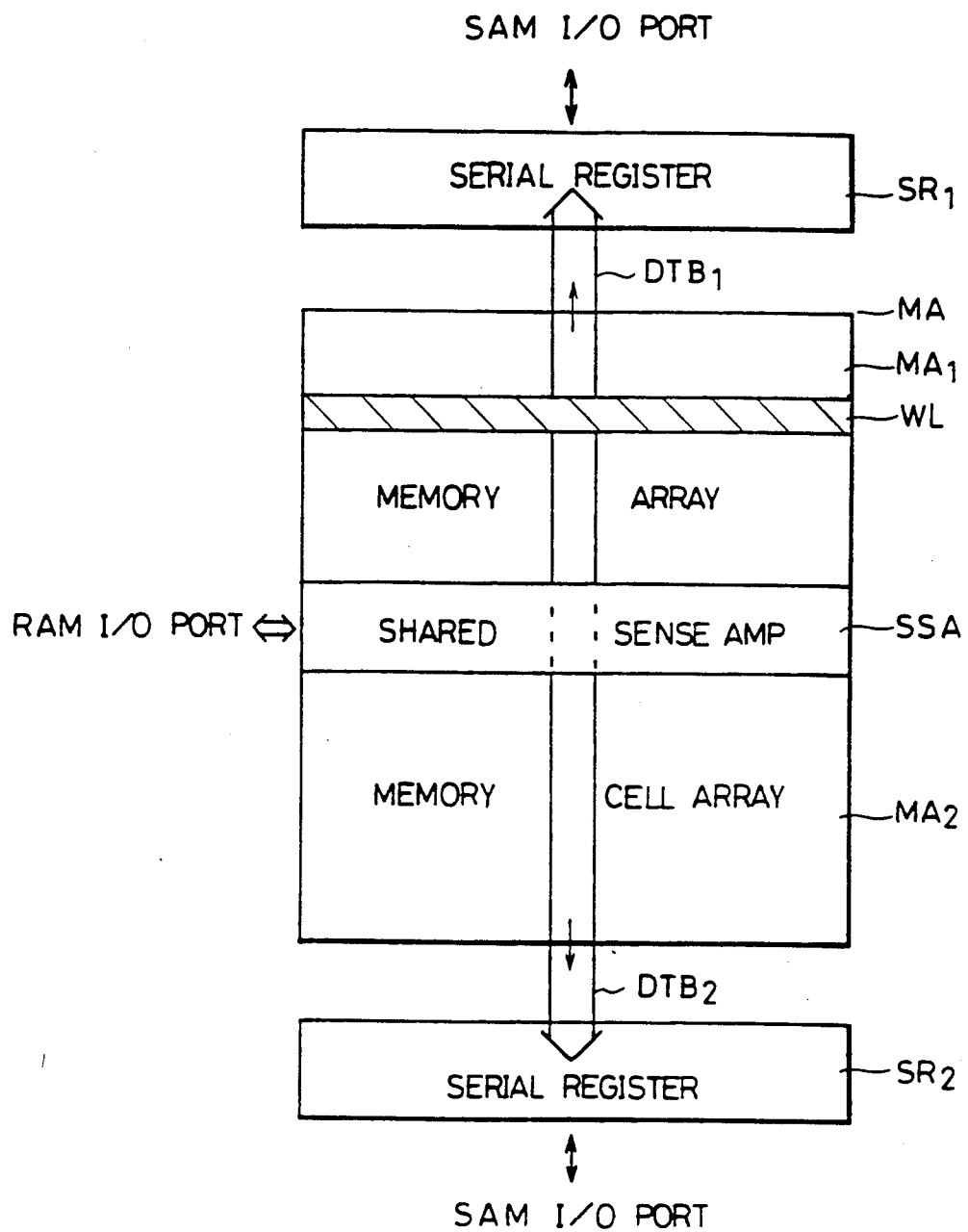
FIG. 1 shows a principle of an operation of a multiport semiconductor memory device according to the invention.

FIG. 1 shows a principle of an operation of a multiport semiconductor memory device (will be called merely a dual port RAM, because it includes two ports and its use is not restricted to a video processing) of the invention. In FIG. 1, a RAM array MA forming a RAM port includes a first memory cell array MA1 and a second memory cell array MA2. A shared sense amplifier circuit SSA is disposed between first memory cell array MA1 and second memory cell array MA2.

First memory cell array MA1 can transfer data to and from a first serial register SR1 through a first data transferring bus DTB1. Second memory cell array MA2 can transfer the data to and from a second serial register SR2 through a second data transferring bus DTB2. Data transfer from memory cell array MA (MA1 or MA2) to serial register SR (SR1 or SR2) is carried out in a read transfer cycle.

Figure 2:
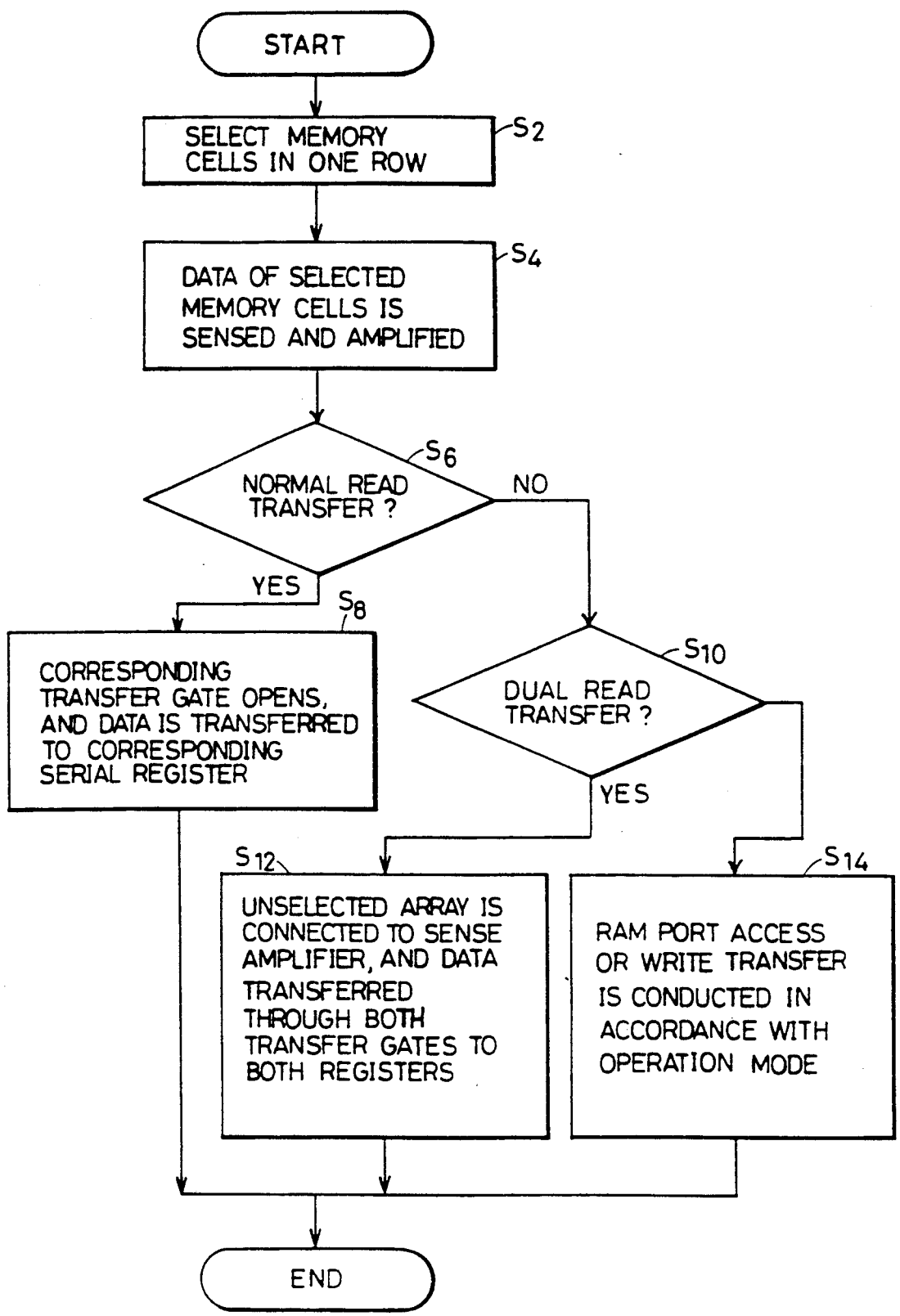
FIG. 2 is a flow diagram showing an operation of a multiport semiconductor memory device according to the invention.

The read transfer cycle according to the invention includes a normal read transfer cycle in which data is transferred from one memory cell array MA1 (or MA2) to corresponding serial register SR1 (or SR2), and "dual" read transfer cycle in which data is transferred from one memory cell array (MA1 or MA2) to two serial registers SR1 and SR2. Now, the data transferring operation in the dual port RAM of the invention will be briefly described with reference together to an operation flow diagram of FIG. 2.

First, memory cells in one row are selected in RAM array MA (step S2). FIG. 1 shows a state in which a word line WL in memory cell array MA1 is selected.

Then, the data of the memory cells connected to the selected row WL is sensed and amplified by shared sense amplifier circuit SSA (step S4). In this operation, memory cell array MA2 is isolated from sense amplifiers in shared sense amplifier circuit SSA, and only memory cell array MA1 is connected to each sense amplifier in shared sense amplifier circuit SSA.

After shared sense amplifier circuit SSA sensed and amplified the memory cells' data, the data transferring operation is carried out. First, a direction of the data transfer cycle is determined (step S6). If the cycle is determined to be the normal read transfer cycle, a transfer gate included in a corresponding data transferring bus opens and data in each memory cell connected to the selected row is transferred to the corresponding serial register. In FIG. 1, first data transferring bus DTB1 provided for memory cell array MA1 is activated and the data of the memory cells connected to word line WL are transferred to serial register SR1 in the normal read transfer cycle (step S8).

When the cycle is not the normal read transfer cycle, it is determined whether the cycle is the dual read transfer cycle or not (step S10). A manner for setting the normal read transfer cycle and dual read transfer cycle will be described later. If it is determined that the dual read transfer cycle is set, unselected memory cell array is also connected to each sense amplifier in shared sense amplifier circuit SSA, and both data transferring buses DTB1 and DTB2 are activated, so that the transfer gates contained therein open to transfer the data.

Referring to FIG. 1, in the dual read transfer cycle, after the data of the memory cells connected to word line WL are sensed and amplified by shared sense amplifier circuit SSA, memory cell array MA2 is connected to each sense amplifier in shared sense amplifier circuit SSA, and the data of the memory cells connected to selected word line WL are transmitted to respective columns in memory cell array MA2. Thereafter, both data transferring buses DTB1 and DTB2 are activated, so that the data are transferred between memory cell array MA1 and serial register SR1 through data transferring bus DTB1 and the data are transferred through data transferring bus DTB2 from memory cell array MA2 to serial register SR2. As a result, the data of the memory cells in one row connected to selected word line WL is transferred to serial registers SR1 and SR2 in the same cycle (step S12).

If it is determined that the cycle is not the dual read transfer cycle in step 10, the read transfer cycle is not conducted, and the write transfer cycle or the access to the RAM port is conducted in accordance with the designated operation mode (step S14).

Figure 3:
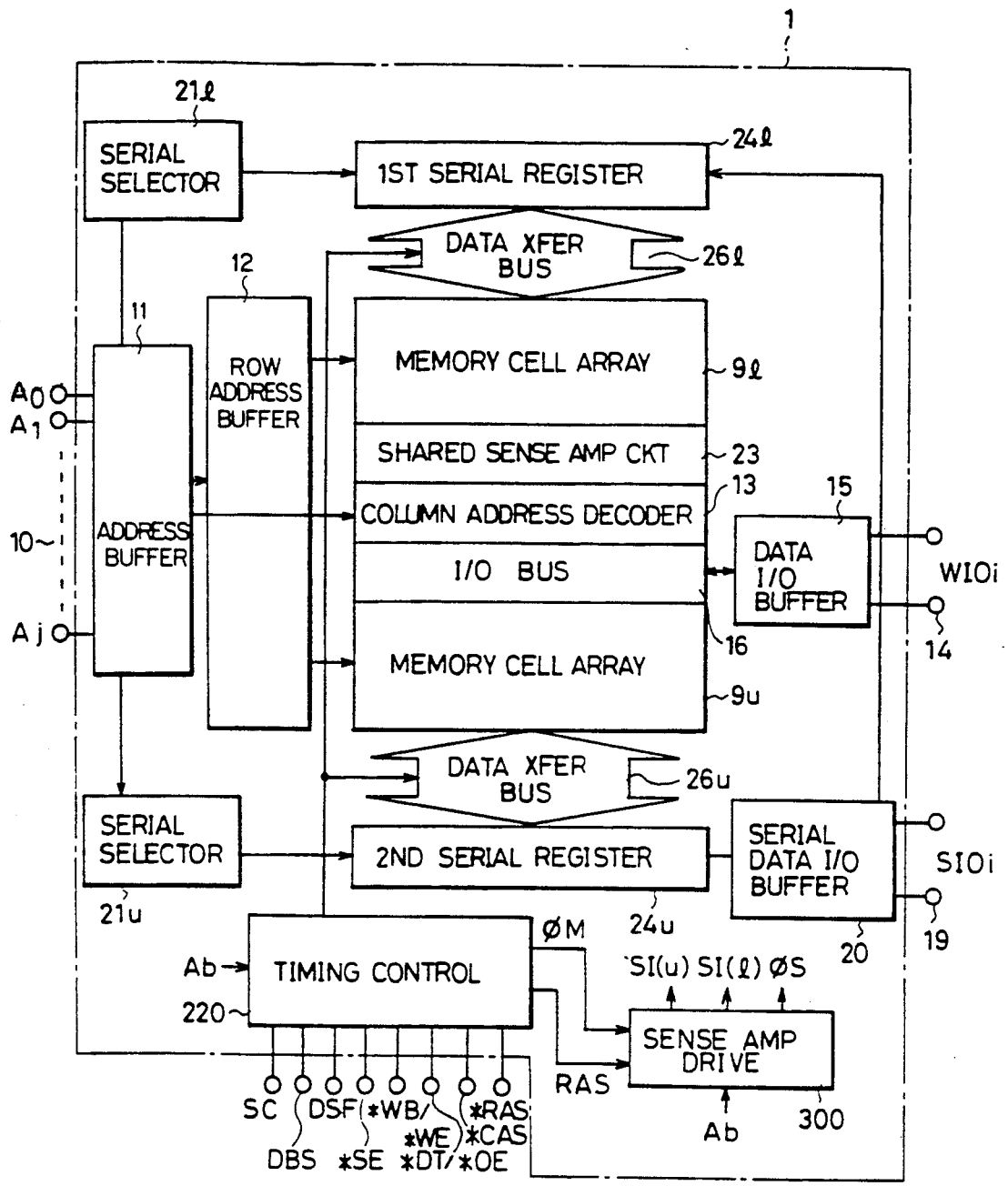
FIG. 3 shows an overall construction of a dual port RAM according to an embodiment of the invention.
Figure 11:
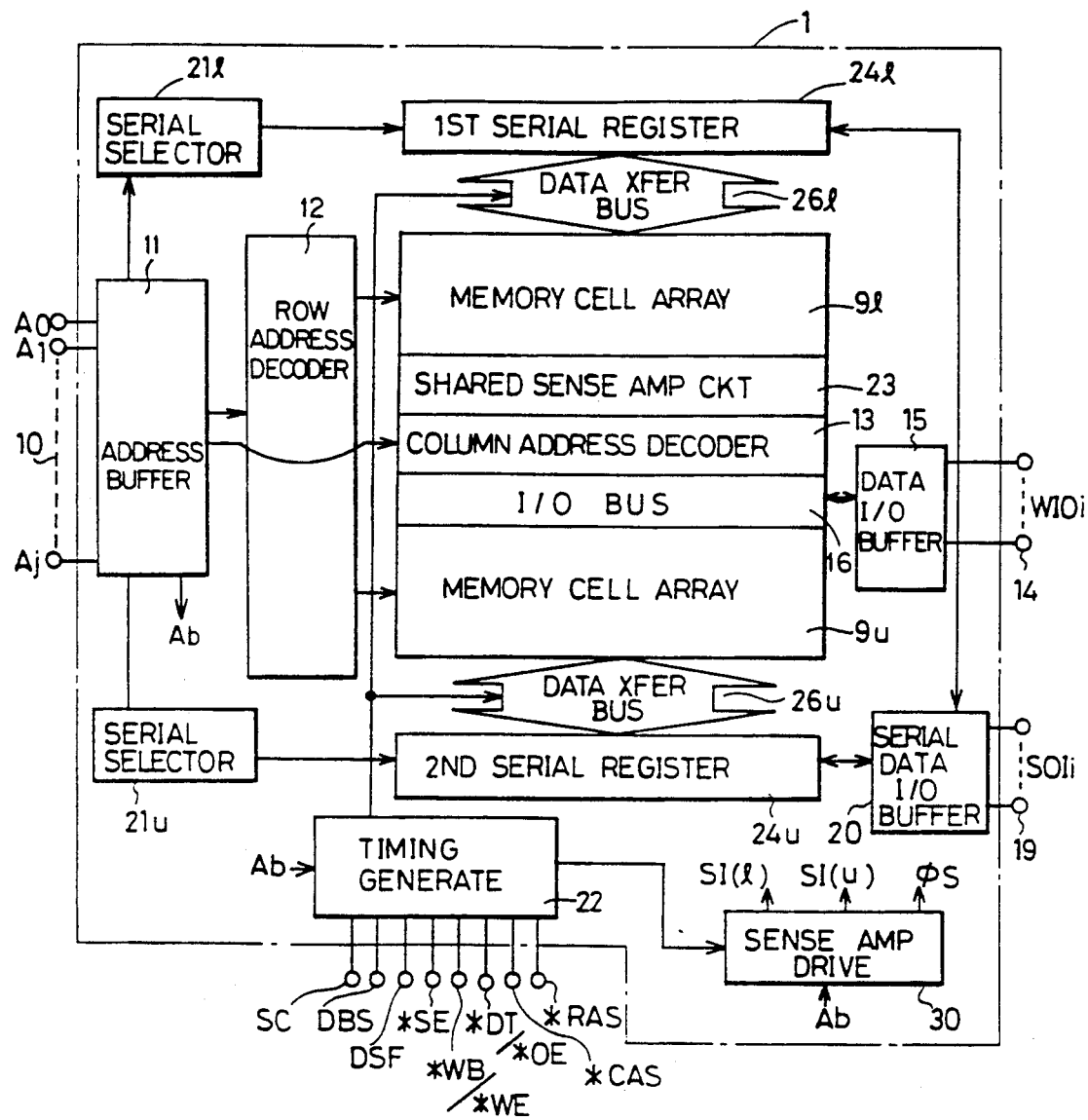
FIG. 11 shows a construction of a video RAM in which a DRAM of a shared sense amplifier structure is used in a RAM port.

FIG. 3 shows an overall construction of a dual port RAM according to an embodiment of the invention. In FIG. 3, parts and portions corresponding to those of the dual port RAM shown in FIG. 11 bear the same reference numerals or characters, and will not be detailed hereinafter. The dual port RAM shown in FIG. 3 employs a different configuration for generating a transfer control signal in the read transfer cycle, but includes a memory array part and a serial register part of which constructions are similar to those shown in FIG. 11.

Referring to FIG. 3, a timing generating circuit 220 is responsive to externally applied control signals SC, DBS, DSF, *SE, *WB/*WE, *DT/*OE, *CAS and *RAS as well as array designating signal Ab to generate a data transfer control signal as well as a dual read transfer cycle designating signal φM. The operation to be actually conducted in this read transfer cycle, i.e., normal read transferring mode operation or dual read transferring mode operation, is decided by combination of the states of signals *WB/*WE, *DT/*OE, DSF and

*SE at the falling edge of signal *RAS. The combination of these states will be described later.

A sense amplifier drive circuit 300 is responsive to dual read transfer instructing signal φM and internal control signal RAS supplied from timing control circuit 220 as well as array designating signal Ab to generate connection control signals SI(u) and SI(l) for controlling connection and isolation of sense amplifiers in shared sense amplifier circuit 23 to and from memory cell arrays 9a and 9b. Sense amplifier drive circuit 300 is also responsive to control signal RAS to generate sense amplifier activating signal φS.

When the normal read transfer cycle is designated, timing control circuit 220 activates the data transferring bus which is provided for the memory cell array designated by array designating signal Ab. When the dual read transfer cycle is designated, timing control circuit 220 ignores array designating signal Ab, and activates both data transferring buses 26l and 26u as well as dual read transfer cycle designating signal φM.

Figure 12:
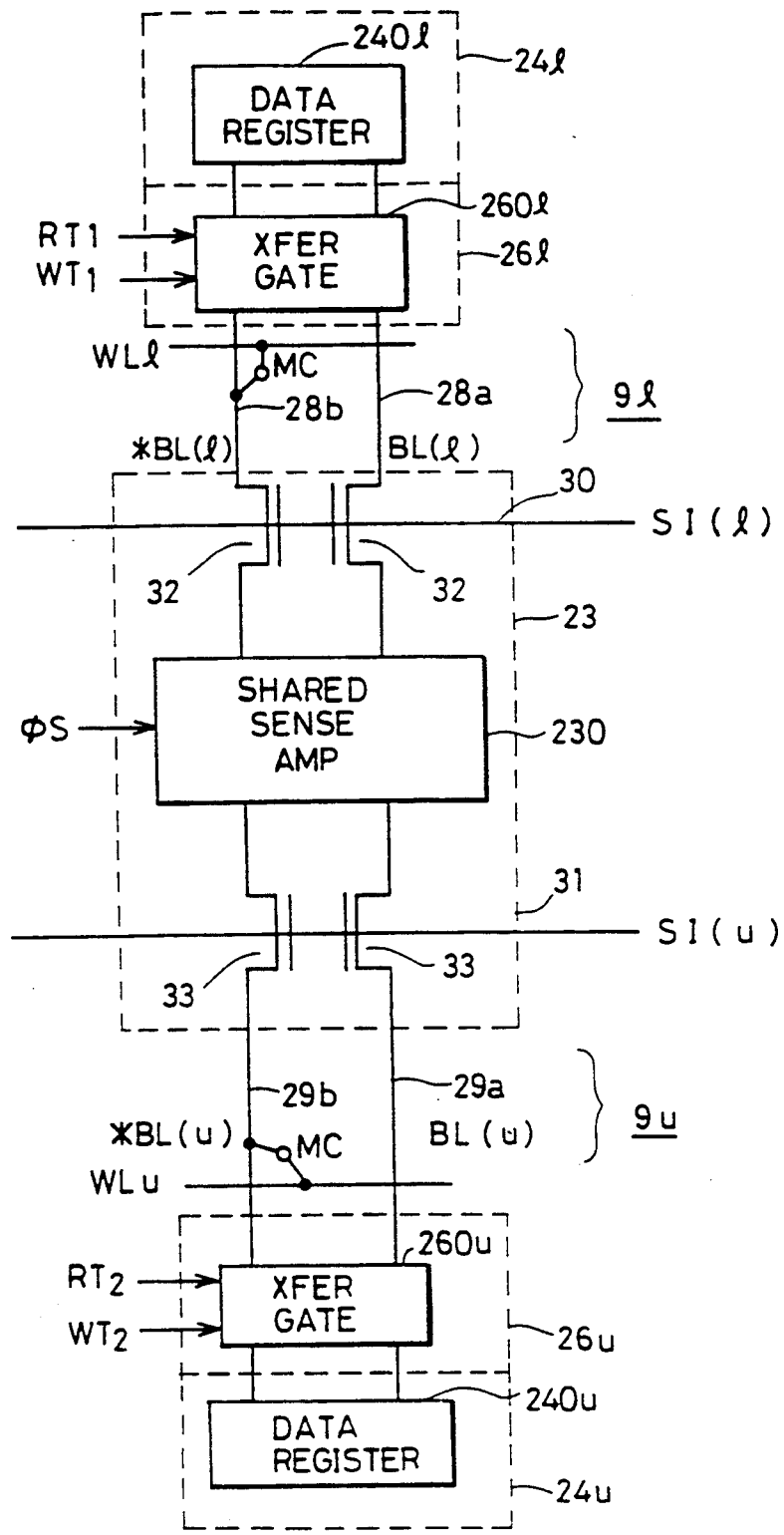
FIG. 12 shows a construction of a main part of a video RAM shown in FIG. 11.
Figure 13:
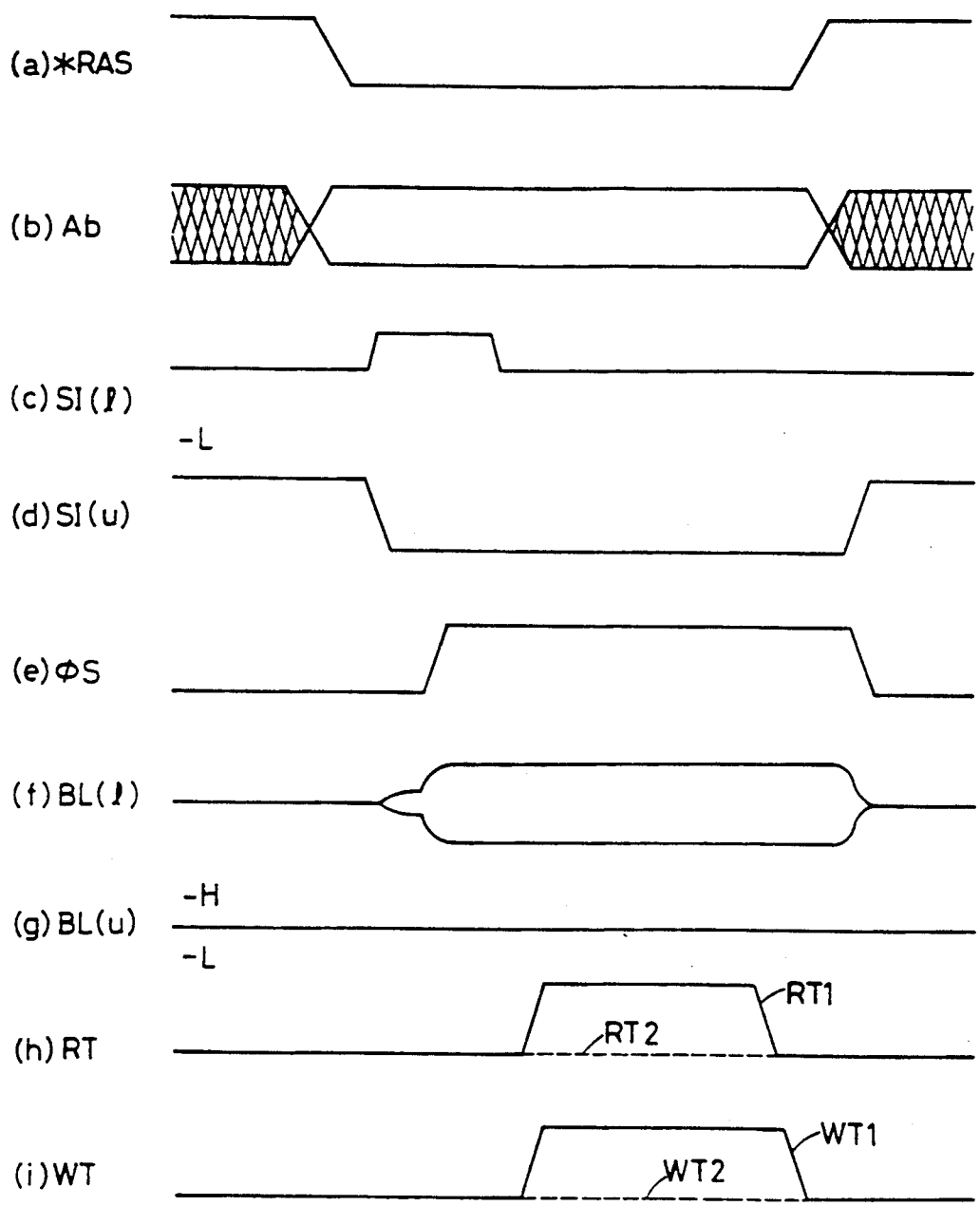
FIGS. 13(a) to 13(i) are signal waveform diagrams showing a data transferring operation of a video RAM shown in FIGS. 11 and 12.

When the dual read transfer cycle is designated and signal φM is generated, sense amplifier drive circuit 300 connects the memory cell array including the selected row to the sense amplifiers in shared sense amplifier circuit 23 to generate sense amplifier activating signal φS. After the completion of the sensing operation, sense amplifier drive circuit 300 connects the unselected memory cell array (i.e., memory cell array isolated from the sense amplifiers in the shared sense amplifier circuit) to each sense amplifier in shared sense amplifier circuit 23. In the other operation modes, sense amplifier drive circuit 300 is responsive to signals RAS and Ab to connect only the memory cell array including the selected row to each sense amplifier in the shared sense amplifier circuit 23 for conducting the sensing operation by activating the sense amplifiers. Memory cell arrays 9u and 9l, data transferring buses 26l and 26u, and serial registers 24l and 24u are similar to those shown in FIG. 12. Now, the read transferring operation of the dual port RAM according to the embodiment of the invention will be described below.

Figure 4:
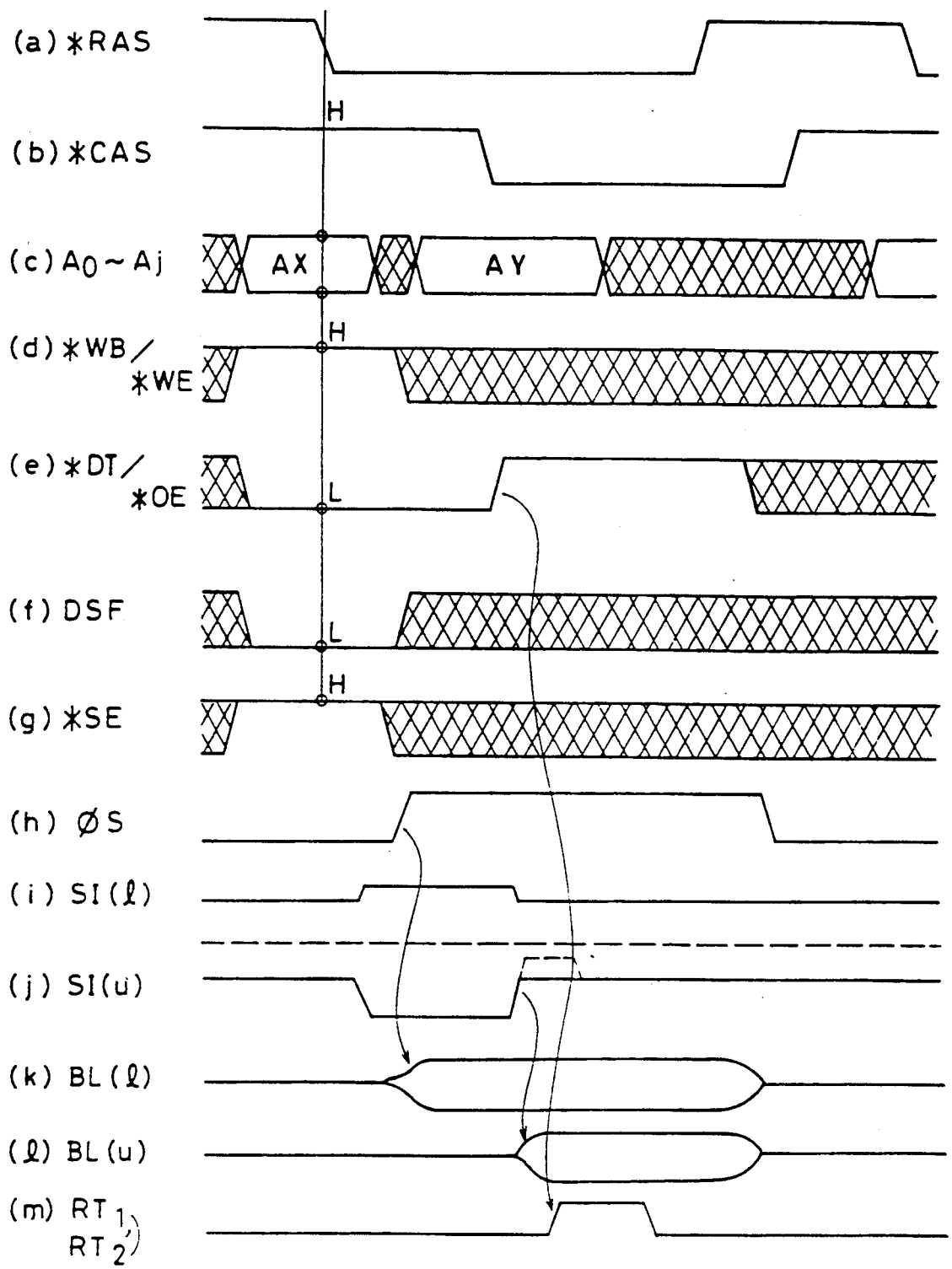
FIGS. 4(a) to 4(m) are signal waveform diagrams showing an operation in a dual read transfer cycle of a dual port RAM according to an embodiment of the invention.

FIG. 4 is a signal waveform diagram showing an operation in the dual read transfer cycle. Now, the operation in the dual read transfer cycle will be described below with reference to FIGS. 3, 4 and 12.

The dual read transfer cycle is designated by setting signals *DT/*OE and DSF at "L" and setting signals *WB/*WE and *SE at "H" at the falling edge of signal *RAS. In response to the fall of signal *RAS, address buffer 11 generates the internal row address signal, which is decoded by row address decoder 12 to select the corresponding row in memory cell arrays 9u and 9l. It is assumed that row address AX is contained in memory cell array 9l.

Array designating signal Ab included in the internal row address supplied from address buffer 11 is applied to sense amplifier drive circuit 300. Sense amplifier drive circuit 300 responds to array designating signal Ab by increasing the level of signal SI(l) to a level higher than "H" and lowering the level of signal SI(u) to "L". Thereby, memory cell array 9l is connected to the sense amplifiers 230 in shared sense amplifier circuit 23, and memory cell array 9u is isolated from shared sense amplifiers 230 (see the operations of gates 32 and 33 in FIG. 12).

Then, sense amplifier drive circuit 300 responds to control signal RAS supplied from timing control circuit 220 by generating sense amplifier activating signal φS. Thereby, the data of the memory cells, which has been transferred to each bit line of memory cell array 9l, is sensed and amplified by the shared sense amplifiers 230 (FIG. 12), and the potential on each column (bit line pair) in memory cell array 9l goes to "H" or "L" in accordance with the read out memory cell data.

Timing control circuit 220 generates dual read transfer cycle designating signal φM which is applied to sense amplifier drive circuit 300. Sense amplifier drive circuit 300, in response to signal φM, raises connection control signal SI(u) from "L" to "H" after the data on each bit line pair in memory cell array 9l is fully developed after the sensing operation. Thereby, gate 33 shown in FIG. 12 becomes conductive, and memory cell data which has been transmitted to each bit line pair in memory cell array 9l is transmitted to the corresponding bit line pair in memory cell array 9u. When signal SI(u) is raised from "L" toward "H" in the dual read transfer cycle, it may be raised to a level higher than the level "H" of the conventional supply voltage Vcc so as to prevent the signal less which may be caused by the threshold voltage of the connection control gate. In this case, signal SI(l) may be maintained at the level of "H" without raising the level.

In the dual read transfer cycle, timing control circuit 220 ignores array designating signal Ab, and responds to the rise of signal *DT/*OE by generating read transfer instructing signals RT1 and RT2. Thereby, both data transferring buses 26l and 26u are activated, and the data of each bit line pair on memory cell array 9l is transmitted to first serial register 24l, and the data of each bit line pair on memory cell array 9u is transmitted to second serial register 24u. The data of each bit line pair in memory cell array 9u is the data of each memory cell connected to the selected word line in memory cell array 9l. Therefore, both first and second serial registers 24l and 24u store the data of the memory cells in one row of selected row address AX in memory cell array 9l.

After the read transfer cycle, serial registers 24l and 24u enter the data output mode. In this mode, serial selectors 21l and 21u designate the first read address in accordance with column address AY applied at the falling edge of signal *CAS. The register, i.e., first or second serial register 24l or 24u, to be actually connected to serial data input/output buffer 20 is decided by externally applied control signal DBS.

In the dual read transfer cycle shown in FIG. 4, read transfer instructing signals RT1 and RT2 are generated at the same timing. However, read transfer instructing signal RT1 may be first generated, and after the data of each bit line pair in memory cell array 9u becomes definite, read transfer instructing signal RT2 may be generated. Signals RT1 and RT2 can be generated at any timings, provided that the data of the memory cells connected to the selected row in memory cell array 9l or 9u can be stored in first and second serial registers 24l and 24u in one transfer cycle.

The operation has been described for the case that the word line (row) in memory cell array 9l is selected. A similar operation is performed in a case that a word line (row) in memory cell array 9u is selected. Also in the latter case, the data of the memory cells on one row of memory cell array 9u can be transferred to first and second serial registers 24l and 24u in the same transfer cycle.

After the dual read transfer cycle shown in FIG. 4 is carried out, one row in memory cell array 9u is selected, and the write transfer cycle is designated for transferring the data from second serial register 24u to the selected row in memory cell array 9u. In this operation, the data of the memory cells on the selected row of memory cell array 9l are transmitted to the newly selected row in memory cell array 9u, and thus the data can be eventually transferred between memory cell array 9l and memory cell array 9u. Also in this operation, the data of first serial register 24l can be transferred to any row in memory cell array 9u, if the write transfer was conducted before the dual read transfer cycle with the same row in the array 9l designated. That is, if the operations are conducted in an order of the write transfer cycle, dual read transfer cycle and write transfer, one serial register can transfer the data to any row in memory cell arrays 9u and 9l.

In the shared sense construction described above, connection control signals SI(l) and SI(u) are set at "H" during standby, and the level of connection control signal SI (SI(l) or SI(u)) for selected memory cell array (i.e., memory cell array including the selected row) is raised higher than the "H" level, i.e., Vcc level. The signals SI(l) and SI(u), however, can have arbitrary potential levels, provided that following conditions are satisfied. That is; in the sensing operation by shared sense amplifier circuit 23, each column (bit line pair) in the selected memory cell array is connected to shared sense amplifier 230 while each column in the unselected memory cell array is isolated from the same shared sense amplifier 230, and, after the completion of the sensing operation, each bit line pair in both memory cell arrays 9l and 9u is connected to shared sense amplifier 230.

Figure 5:
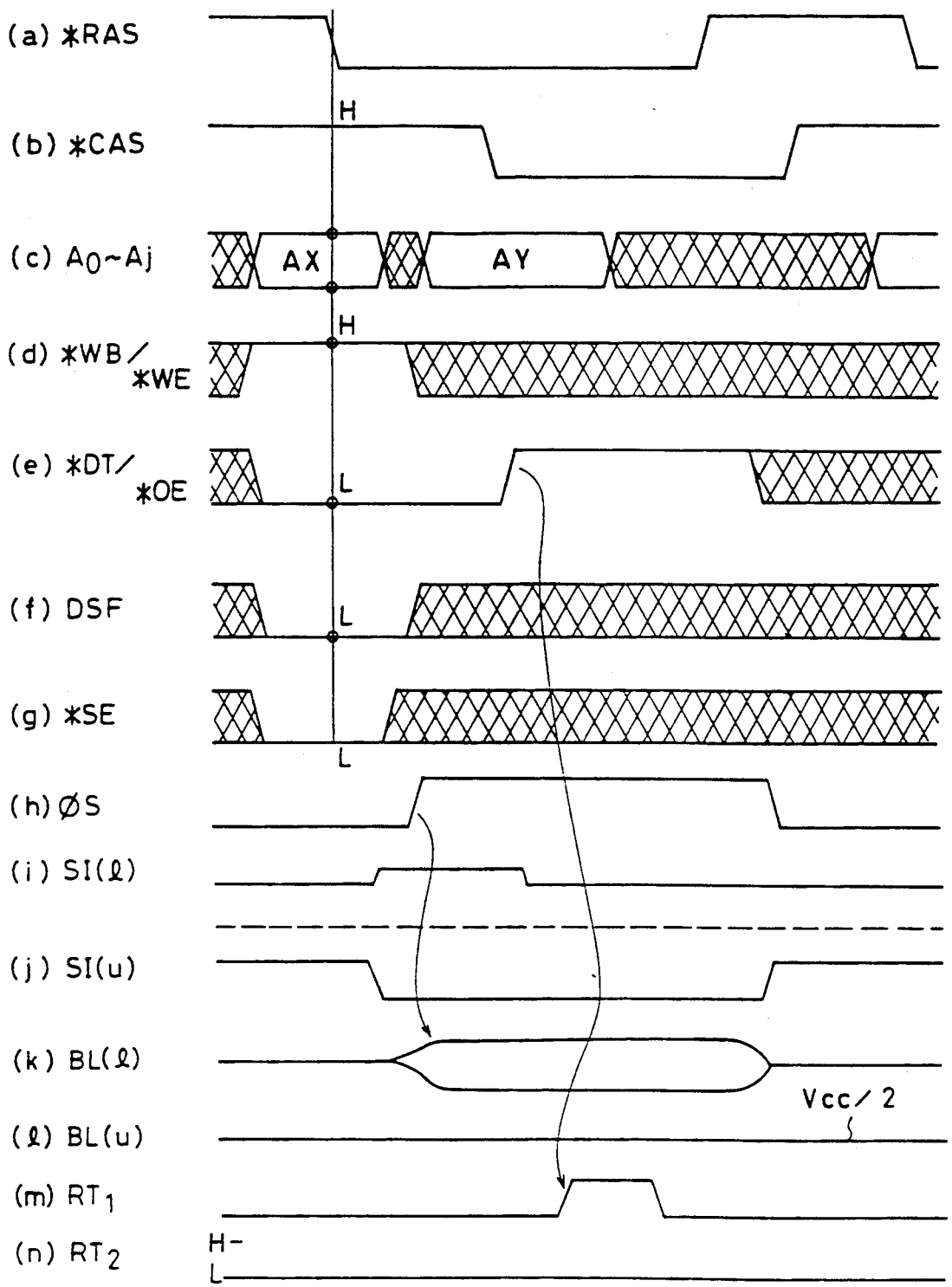
FIGS. 5(a) to 5(n) are signal waveform diagrams showing an operation in a normal read transfer cycle of a dual port RAM according to an embodiment of the invention.

FIG. 5 is a signal waveform diagram showing an operation in the normal read transfer cycle. Now, the normal read transfer cycle operation will be described with reference to FIGS. 3, 5 and 12.

The normal read transfer cycle is designated by setting signal *WB/*WE at "H" and setting signals *DT/*OE, DSF and *SE at "L", at the falling edge of signal *RAS. Timing control circuit 220 detects the designation of the normal read transfer cycle from the combination of the above control signals. In the RAM port, address signal bits A0-Aj are latched as a row address signal at the falling edge of signal *RAS, so that the row corresponding to the row address AX designated by this row address signal is selected in the memory cell arrays 9l and 9u. It is assumed that one row in the memory cell array 9l is selected in the following description.

In the normal read transfer cycle, timing control circuit 220 does not generate control signal $\phi$M. Sense amplifier drive circuit 300, therefore, responds to array designating signal Ab and control signal RAS by further raising the level of connection control signal SI(l) from "H", and lowering the other connection control signal SI(u) to "L". Thereby, each column in memory cell array 9l is connected to sense amplifier 230 in shared sense amplifier circuit 23, and each column in memory cell array 9u is isolated from sense amplifier 230. Then, sense amplifier drive circuit 300 generates sense amplifier activating signal $\phi$S, and the memory cell data of each column in memory cell array 9l is sensed, amplified and latched.

After the completion of the sensing operation, timing control circuit 220 generates read transfer instructing signal RT1 in response to the rise of data transfer instructing signal *DT/*OE in accordance with array designating signal Ab. Thereby, the data of the memory cells connected to the selected row in memory cell array 9l is transferred through data transferring bus 26l to first serial register 1. Memory cell array 9u is isolated from each sense amplifier in shared sense amplifier circuit 23, and thus each column holds the intermediate potential, i.e., precharged potential. Also read transfer instructing signal RT2 is not generated. Therefore, data transferring bus 26u remains in the inactive state. In this state, column address AY which has been captured at the falling edge of signal *CAS is latched as the first address in serial selectors 21l and 21u. Thereafter, the SAM port enters the data output mode. Also in this mode, the register, i.e., serial registers 24l or 24u, to be actually connected to serial data input/output buffer 20 is decided by externally applied control signal DBS.

In the construction described above, the designation of the dual read transfer cycle and normal read transfer cycle is achieved by fixing the state of serial enable signal *SE, which is left at an arbitrary state in the prior art when the read transfer cycle is set. Conversely, the normal read transfer cycle may be designated when signal *SE is "H", and dual read transfer cycle may be designated when signal *SE is "L".

Figure 6:
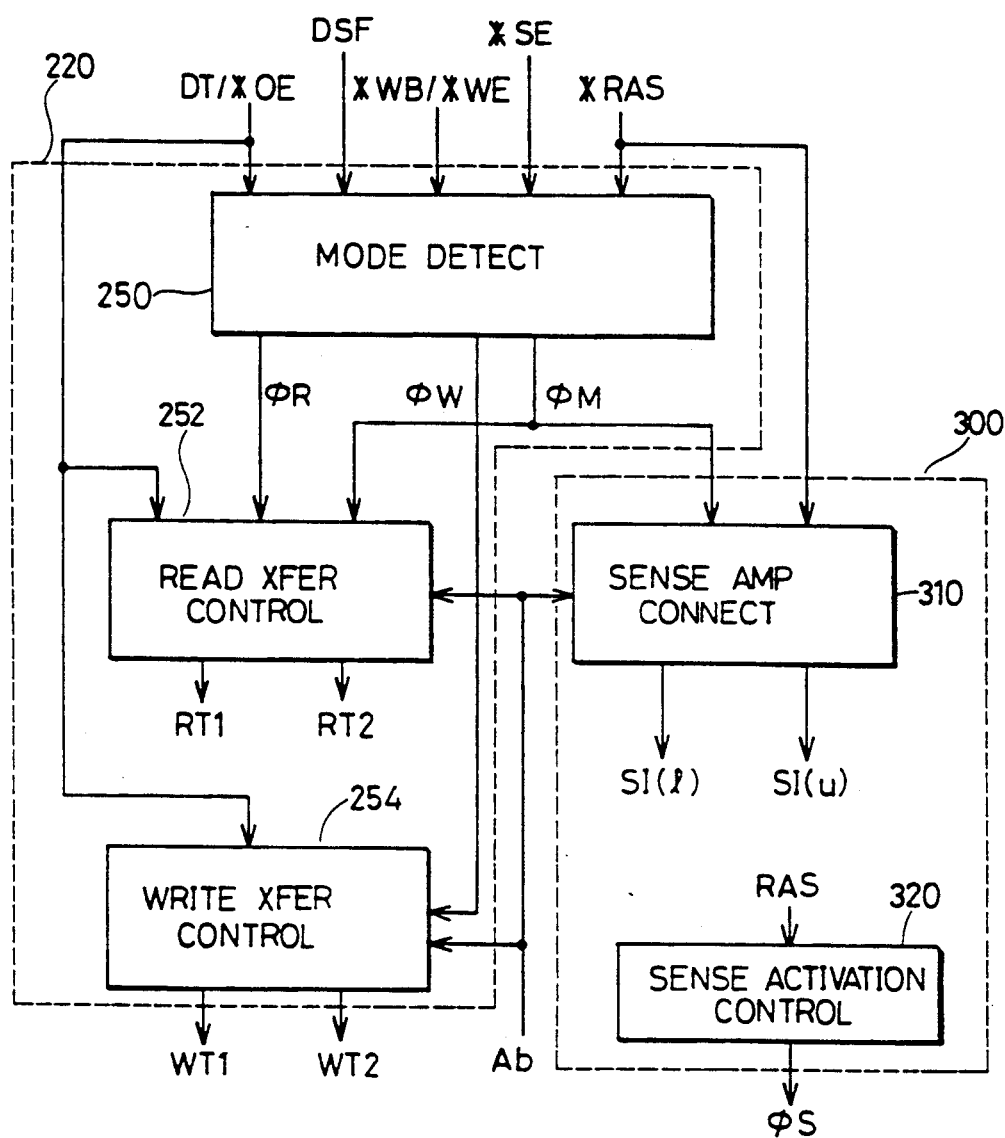
FIG. 6 shows a specific construction of a timing control circuit and a sense amplifier drive circuit shown in FIG. 3.
Figure 7:
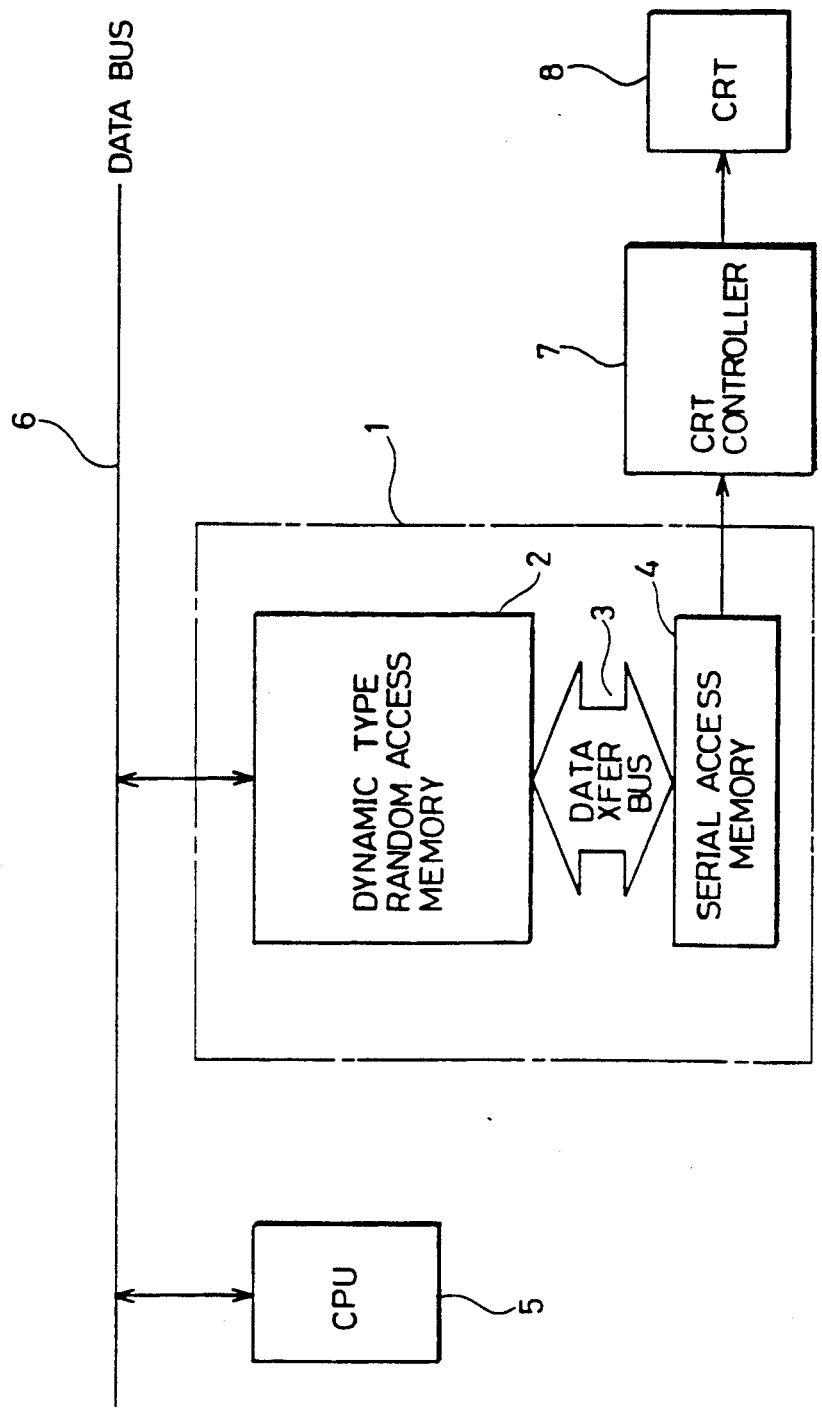
FIG. 7 shows a construction of an image processing system using a video RAM.
Figure 8:
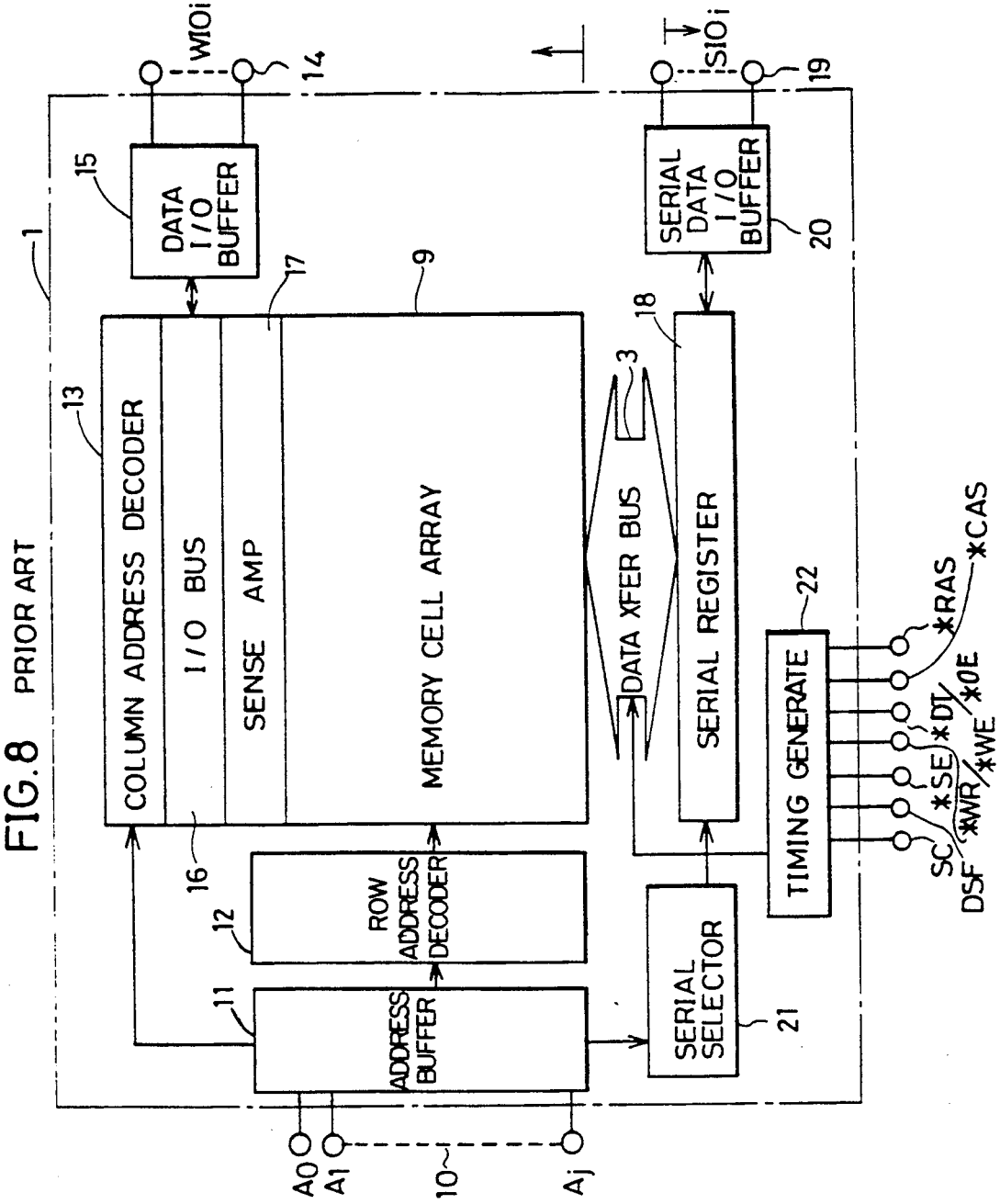
FIG. 8 shows a construction of a conventional dual port RAM (video RAM)
Figure 9:
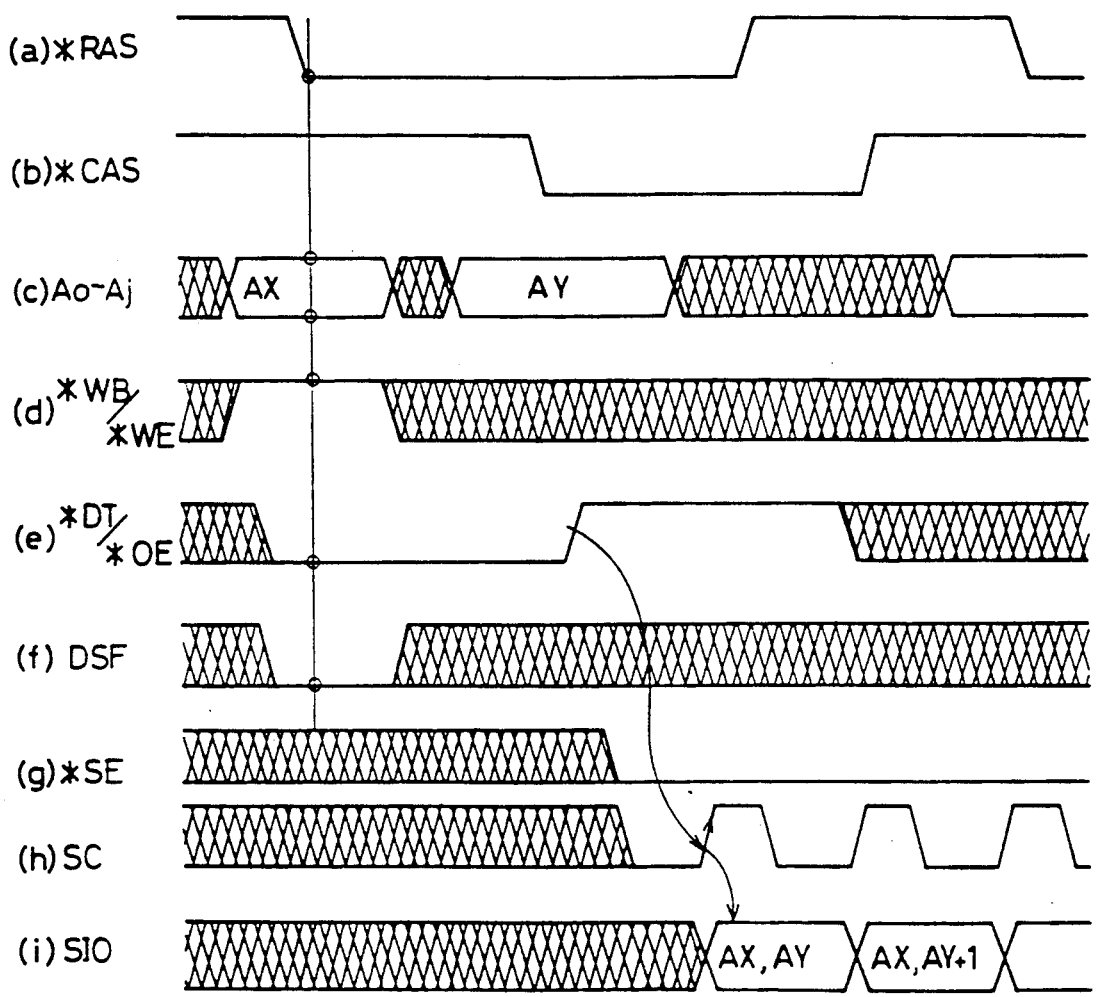
FIGS. 9(a) to 9(i) are signal waveform diagrams showing an operation in a read transfer cycle of a conventional video RAM.
Figure 10:
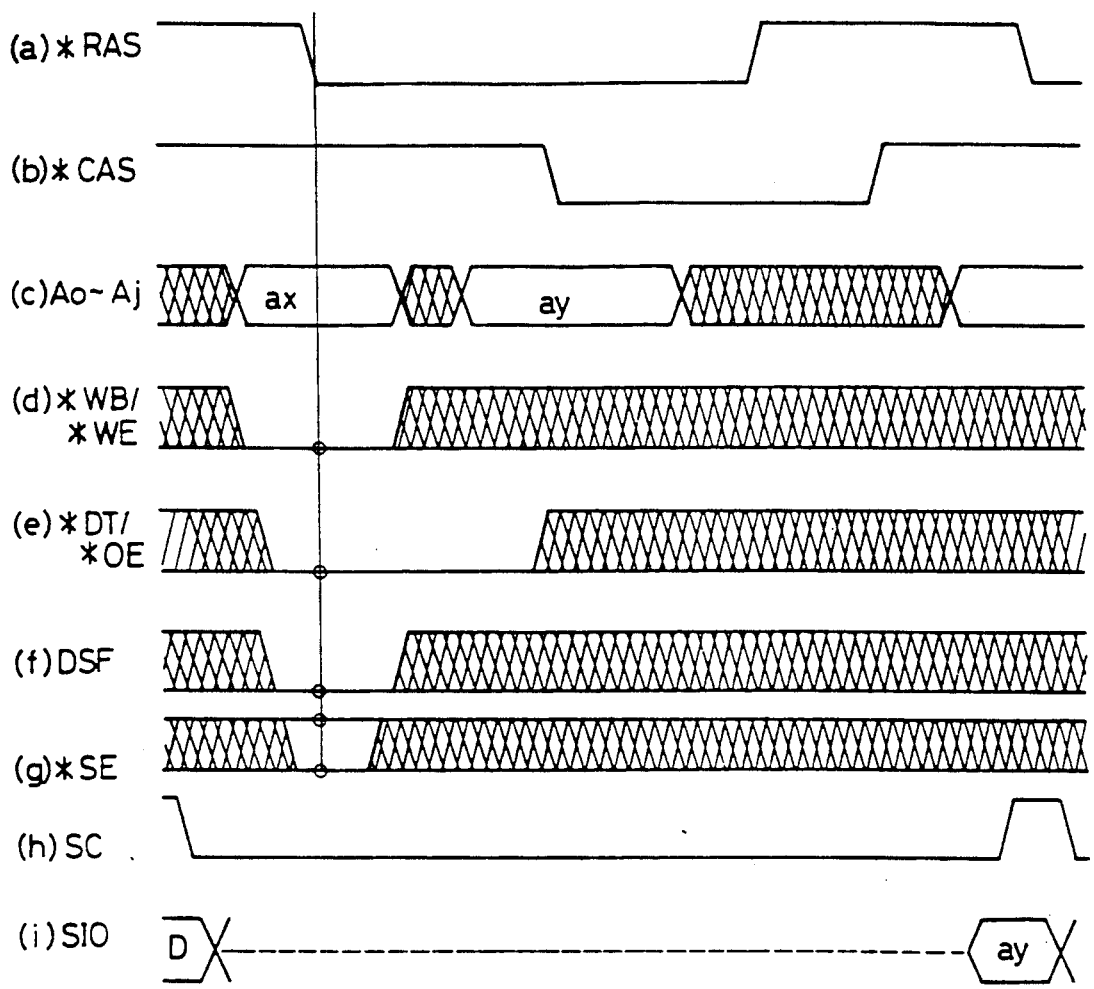
FIGS. 10(a) to 10(i) are signal waveform diagrams showing an operation in a write transfer cycle of a conventional video RAM.

FIG. 6 shows a construction of the timing control circuit and the sense amplifier drive circuit shown in FIG. 3. Portions of timing control circuit 220 which does not relates to data transferring operation are not shown in FIG. 6. A buffer circuit (which generates the internal control signal) for signal *DT/*OE and signal *RAS is not shown in FIG. 6.

Referring to FIG. 6, timing control circuit 220 includes a mode detecting circuit 250 which detects the designated operation mode in response to externally applied control signals *RAS, *SE, *WB/*WE, DSF and *DT/*OE, a read transfer control circuit 252 which generates read transfer instructing signals RT1 and RT2 in response to read transfer cycle detection signal $\phi$R supplied from mode detecting circuit 250 as well as dual read transfer instructing signal $\phi$M, array designating signal Ab and transfer instructing signal *DT/OE, and a write transfer control circuit 254 which generates control signals WT1 and WT2 in the write transfer cycle. Write transfer control circuit 254 is activated in response to a write transfer cycle detection signal $\phi$W supplied from mode detecting circuit 250, and is also responsive to the rise of signal *DT/*OE to generate the write transfer instructing signal, which is used for activating the data transferring bus provided corresponding to the memory cell array designated by array designating signal Ab.

When read transfer control circuit 252 receives both signals $\phi$R and $\phi$M from the mode detecting circuit 250, read transfer control circuit 252 ignores array designating signal Ab, and generates read transfer instructing signals RT1 and RT2 in response to the rise of signal *DT/*OE. Read transfer control circuit 252 may have a construction in which data transferring bus corresponding to the memory cell array designated by array designating signal Ab is activated earlier.

Sense amplifier drive circuit 300 includes a sense amplifier connecting circuit 310 which receives signal *RAS (i.e., the internal control signal applied by the buffer circuit in practice)) and dual read transfer cycle designating signal $\phi$M supplied from mode detecting circuit 250 to generate connection control signals SI(l) and SI(u), and a sense amplifier activating circuit 320 which generates sense amplifier activating signal $\phi$S in response to internal control signal RAS (i.e., inverted signal of signal *RAS). Sense amplifier connecting circuit 310 also receives array designating signal Ab. When dual read transfer cycle designating signal φM is generated, sense amplifier connecting circuit 310 first connects each column in the memory cell array designated by array designating signal Ab to the sense amplifier contained in shared sense amplifier circuit 23, and also isolates each column in the unselected memory cell array from this shared sense amplifier. Then, sense amplifier connecting circuit 310 connects each column in the isolated memory cell array to the shared sense amplifier.

When the dual read transfer cycle designating signal φM is not generated, sense amplifier connecting circuit 310 connects each column in the memory cell array designated by array designating signal Ab to the shared sense amplifier, and isolates each column in the unselected memory cell array from the shared sense amplifier. Sense amplifier activating circuit 320 delays internal control signal RAS for a predetermined time, and then generates sense amplifier activating signal φS.

In the construction described above, memory cell array 9l and memory cell array 9u are divided by shared sense amplifier circuit 23. The dual port RAM may includes memory cell arrays of multiple planes. It is required only to divide each memory plane into memory cell array blocks by a shared sense amplifier circuit.

The memory device of the invention is not restricted to dual port RAM having one RAM port and one SAM port, and may include more ports.

According to the invention, as described hereinabove, the RAM port of the shared sense amplifier structure has the construction in which the data of the memory cells at any row in the RAM memory cell array can be transferred to the two serial registers in the one data transfer cycle. Therefore, the dual port RAM can flexibly cope with any image data processing.

After the data in the memory cells on one row of the selected memory cell array is transferred to the two serial registers, the data can be transferred to any row in the unselected memory cell array from the corresponding serial register. Thereby, the data can be transferred between the memory cell arrays, and also the data can be transferred from one serial register to any row. Therefore, the multiport RAM of the shared sense amplifier structure can have many functions, and can flexibly cope with complicated image data processing applications. Accordingly, the image data processing system using this multiport RAM can have the improved image information processing performance.

Although the present invention has been described and illustrated in detail, It is clearly understood that the same is by way of illustration and example only and is not to be taken by way of limitation, the spirit and scope of the present invention being limited only by the terms of the appended claims.

What is claimed is:

1. A multiport memory device comprising:
    a first memory cell array accessible in a random sequence and having a plurality of memory cells arranged in rows and columns;
    a second memory cell array accessible in a random sequence and having a plurality of memory cells arranged in rows and columns;
    sense amplifying means commonly employed for said first and second memory cell arrays and for sensing and amplifying data of memory cells on a row selected in said first or second memory cell arrays;
    connection means for connecting the memory cells on the selected row to said sense amplifying means;
    a first data storage means accessible in a serial sequence and having a storage capacity sufficient for storing data of memory cells on a row in said first memory cell array;
    a second data storage means accessible in a serial sequence and having a storage capacity sufficient for storing data of memory cells on a row in said second memory cell array;
    a first data transfer means for transferring data between said first memory cell array and said first data storage means;
    a second data transfer means for transferring data between said second memory cell array and said second data storage means; and
    control means responsive to a transfer control signal for controlling the connection means, the first data transfer means and the second data transfer means such that data of memory cells of the row selected in said first or second memory cell arrays are transferred both to said first and second data storage means.

2. A multiport memory device according to claim 1, wherein said control means includes
    mode detection means responsive to the transfer control signal for generating a dual transfer signal indicating that data of the memory cells on the row selected should be transferred both to said first and second data storage means;
    connection control means responsive to said dual transfer signal and an array designating signal designating a memory cell array including the row selected, for controlling the connection means such that the memory cell array designated by said array designated signal is connected to said sense amplifying means while the other memory cell array not designated is isolated from said sense amplifying means and then said other memory cell array is connected to the sense amplifying means so as for said other memory cell array to receive data sensed and amplified by said sense amplifying means; and
    transfer control means responsive to said dual transfer signal for activating said first and second data transfer means to enable data transfer from said first memory cell array to said first data storage means as well as from the second memory cell array to said second data storage means.

3. A multiport memory device according to claim 2, wherein
    said mode detection means includes means for inactivating said transfer control means and said connection control means to coupled only the memory cell array including the row selected to said sense amplifying means and to an associated data storage means, in response to no generation of said dual transfer signal.

4. For a multiport memory device including a RAM port accessible in a random sequence and having first and second memory arrays each having a plurality of memory cells arranged in rows and columns, and sense amplifying means commonly employed for said first and second memory arrays for sensing and amplifying data of memory cells on a selected row in said first or second memory arrays, and SAM port accessible in a serial sequence and including a first data storage means provided corresponding to said first memory array and a second data storage means provided corresponding to said second memory array, a method of transferring data between said RAM port and said SAM port comprising the steps of:
- selecting a row in said first or second memory array in response to a row address;
- connecting the selected row to said sense amplifying means in response to an array designating signal for sensing and amplifying data of memory cells on said selected row;
- coupling said first and second memory arrays through said sense amplifying means in response to a first transfer control signal for transferring data sensed and amplifier in one memory array to the other array; and transferring data from said first memory array to said first data storage means and also data from said second memory array to said second data storage means in response to said first transfer control signal.

5. A method according to claim 4, further comprising the steps of transferring the data sensed and amplified from a memory array including the row selected to an associated data storage means while isolating the other memory array from the sense amplifying means, and the memory array including the row selected, in response to no generation of the first transfer control signal and to generation of a second transfer control signal.

* * * * *